(12) United States Patent
Krupyshev et al.

(10) Patent No.: US 9,117,859 B2
(45) Date of Patent: Aug. 25, 2015

(54) COMPACT PROCESSING APPARATUS

(75) Inventors: Alexander G. Krupyshev, Chelmsford, MA (US); Mitchell Drew, Rye, NH (US)

(73) Assignee: Brooks Automation, Inc., Chelmsford, MA (US)

( * ) Notice: Subject to any disclaimer, the term of this patent is extended or adjusted under 35 U.S.C. 154(b) by 1453 days.

(21) Appl. No.: 11/848,845

(22) Filed: Aug. 31, 2007

(65) Prior Publication Data

US 2008/0056856 A1 Mar. 6, 2008

Related U.S. Application Data

(60) Provisional application No. 60/841,399, filed on Aug. 31, 2006.

(51) Int. Cl.
| | |
|---|---|
| *H01L 21/677* | (2006.01) |
| *H01L 21/67* | (2006.01) |
| *H01L 21/687* | (2006.01) |

(52) U.S. Cl.
CPC .... *H01L 21/67196* (2013.01); *H01L 21/67745* (2013.01); *H01L 21/68707* (2013.01)

(58) Field of Classification Search
CPC .. B65J 9/043; B65J 11/0095; H01L 21/67745
USPC ................. 414/744.01, 744.05, 744.1, 744.5; 74/490.01, 490.04
See application file for complete search history.

(56) References Cited

U.S. PATENT DOCUMENTS

| | | | |
|---|---|---|---|
| 5,180,276 A * | 1/1993 | Hendrickson .............. 414/752.1 |
| 5,544,421 A | 8/1996 | Thompson et al. |
| 6,002,840 A * | 12/1999 | Hofmeister .................... 700/245 |
| 6,071,055 A * | 6/2000 | Tepman ......................... 414/217 |
| 6,138,721 A | 10/2000 | Bonora et al. |
| 6,188,323 B1 | 2/2001 | Rosenquist et al. |
| 6,189,404 B1 * | 2/2001 | Hatake et al. ............... 74/490.03 |
| 6,257,827 B1 * | 7/2001 | Hendrickson et al. ......... 414/805 |
| 6,279,724 B1 | 8/2001 | Davis |
| 6,281,516 B1 | 8/2001 | Bacchi et al. |
| 6,450,755 B1 * | 9/2002 | Cameron et al. .......... 414/416.08 |
| 6,464,448 B1 * | 10/2002 | Ha .............................. 414/744.5 |
| 6,481,956 B1 * | 11/2002 | Hofmeister .................... 414/806 |
| 6,485,250 B2 * | 11/2002 | Hofmeister ................ 414/744.1 |
| 6,501,070 B1 | 12/2002 | Bacchi et al. |
| 6,591,162 B1 | 7/2003 | Martin |
| 6,672,820 B1 | 1/2004 | Hanson et al. |
| 6,784,418 B2 | 8/2004 | Bacchi et al. |

(Continued)

FOREIGN PATENT DOCUMENTS

| | | |
|---|---|---|
| JP | 2003297711 | 10/2003 |
| WO | 9932381 | 7/1999 |

(Continued)

*Primary Examiner* — James Keenan (74) *Attorney, Agent, or Firm* — Perman & Green, LLP; Colin C. Durham (57) ABSTRACT

A substrate processing apparatus including a chamber capable of holding an isolated atmosphere and having a front and rear disposed along a longitudinal axis and a transport apparatus located in the chamber, and having twin scara arms and a drive section with a coaxial drive shaft assembly, each shaft of which being operably connected to at least one rotatable link of both scara arms to move the twin scara arms, wherein movement of one of the twin scara arms mirrors movement of another of the twin scara arms across the longitudinal axis.

20 Claims, 7 Drawing Sheets

(56) References Cited

U.S. PATENT DOCUMENTS

| | | |
|---|---|---|
| 6,918,731 B2 | 7/2005 | Talmer |
| 6,944,517 B2 * | 9/2005 | Krupyshev .................... 700/114 |
| 6,986,261 B2 * | 1/2006 | Sasaki et al. .................... 62/201 |
| 7,056,080 B2 * | 6/2006 | Ogawa et al. ............. 414/744.5 |
| 7,114,907 B2 * | 10/2006 | Ogawa et al. ............. 414/744.5 |
| 7,192,241 B2 * | 3/2007 | Momoki .............. 414/744.5 |
| 7,374,386 B2 * | 5/2008 | Talmer ......................... 414/217 |
| 7,572,093 B2 * | 8/2009 | Minami et al. ................ 414/744.5 |
| 7,837,425 B2 * | 11/2010 | Saeki et al. .............. 414/744.5 |
| 7,891,935 B2 * | 2/2011 | Kremerman ............... 414/744.5 |
| 8,376,685 B2 * | 2/2013 | Pietrantonio et al. ...... 414/744.5 |
| 2003/0044261 A1 | 3/2003 | Bonora et al. |
| 2003/0044268 A1 | 3/2003 | Bonora et al. |
| 2003/0053893 A1 * | 3/2003 | Matsunaga et al. ........... 414/217 |
| 2003/0091409 A1 | 5/2003 | Danna et al. |
| 2003/0159277 A1 | 8/2003 | Harris et al. |
| 2003/0159535 A1 * | 8/2003 | Grover et al. .............. 74/490.04 |
| 2004/0154426 A1 * | 8/2004 | Byun ........................ 74/490.01 |
| 2005/0096784 A1 | 5/2005 | Lai |
| 2005/0111956 A1 * | 5/2005 | van der Meulen ......... 414/744.2 |
| 2005/0217053 A1 * | 10/2005 | Kim et al. .................. 15/250.21 |
| 2006/0099063 A1 * | 5/2006 | Pietrantonio et al. ...... 414/744.5 |
| 2007/0009345 A1 | 1/2007 | Hall et al. |
| 2007/0274810 A1 * | 11/2007 | Holtkamp et al. ............ 414/217 |
| 2007/0290150 A1 * | 12/2007 | Krupyshev et al. ...... 250/559.33 |
| 2008/0249651 A1 * | 10/2008 | Hosek et al. .................. 700/121 |
| 2008/0253868 A1 * | 10/2008 | Talmer .......................... 414/217 |
| 2008/0298945 A1 * | 12/2008 | Cox et al. .................. 414/744.7 |
| 2010/0116077 A1 * | 5/2010 | Shimamoto et al. ........ 74/490.01 |
| 2010/0178147 A1 * | 7/2010 | Kremerman et al. ...... 414/744.5 |

FOREIGN PATENT DOCUMENTS

| | | |
|---|---|---|
| WO | 0060414 | 10/2000 |
| WO | 0246864 | 6/2002 |
| WO | 03009347 A2 | 1/2003 |
| WO | 03019630 A2 | 3/2003 |
| WO | 03021643 A2 | 3/2003 |
| WO | 03021645 A2 | 3/2003 |

* cited by examiner

COMPACT PROCESSING APPARATUS

RELATED APPLICATIONS

This application claims priority to U.S. Provisional Patent Application No. 60/841,399 filed on Aug. 31, 2006 the disclosure of which is incorporated by reference herein in its entirety.

BACKGROUND

1. Field

The exemplary embodiments generally relate to substrate processing apparatus and, more particularly, to substrate processing apparatus having compact configurations.

2. Brief Description of Related Developments

Efficiency demands in fabrication of electronic devices has driven a desire for using ever larger semiconductor substrates or wafers. For example, silicone (Si) semiconductor wafers commonly employed in fabrication of electronic devices have grown from 150 mm a few years ago, to 200 mm and then 300 mm. Current industry trends indicate that 350 mm, 400 mm and larger wafers may be commonly used in the near future. The conventional approach for developing the architecture of the fabrication or processing apparatus for processing the ever larger wafers has been to scale up dimensions of earlier processing apparatus commensurate to the larger scale of the bigger wafers. As may be realized, this has lead to processing apparatus that are large and complex, and have an arrangement that may not be optimum for layout in a FAB thus having an adverse impact on the sought after improvements in FAB efficiency.

SUMMARY

In one exemplary embodiment, a substrate processing apparatus is provided. The substrate processing apparatus includes a chamber capable of holding an isolated atmosphere and having a front and rear disposed along a longitudinal axis and a transport apparatus located in the chamber, and having twin scara arms and a drive section with a coaxial drive shaft assembly, each shaft of which being operably connected to at least one rotatable link of both scara arms to move the twin scara arms, wherein movement of one of the twin scara arms mirrors movement of another of the twin scara arms across the longitudinal axis.

In another exemplary embodiment, a substrate transport apparatus is provided. The substrate transport apparatus includes a drive section having a coaxial shaft assembly and a first scara arm rotatably coupled to a transmission unit at a first axis of rotation and a second opposing scara arm rotatably coupled to the transmission unit at a second axis of rotation wherein the transmission unit is coupled to the drive section and is configured to couple the first and second scara arms to the drive section where movement of the second scara arm mirrors movement of the first scara arm across an axis of extension and retraction of the first and second scara arms.

In still another exemplary embodiment, a substrate processing apparatus is provided. The substrate processing apparatus includes a chamber having a front and rear disposed along a longitudinal axis, the front of the chamber being coupled to at least one load lock and a rear of the chamber being coupled to at least one processing module and a transport apparatus located in the chamber for transporting substrate between the at least one load lock and the at least one processing module, the transport apparatus having opposing twin scara arms wherein movement of one of the twin scara arms mirrors movement of another of the twin scara arms across the longitudinal axis, wherein the chamber and the transport apparatus are configured to minimize a distance between the at least one load lock and the at least one processing module.

BRIEF DESCRIPTION OF THE DRAWINGS

The foregoing aspects and other features of the disclosed embodiments are explained in the following description, taken in connection with the accompanying drawings, wherein.

DETAILED DESCRIPTION OF THE EXEMPLARY EMBODIMENT(s)

Figure 1:
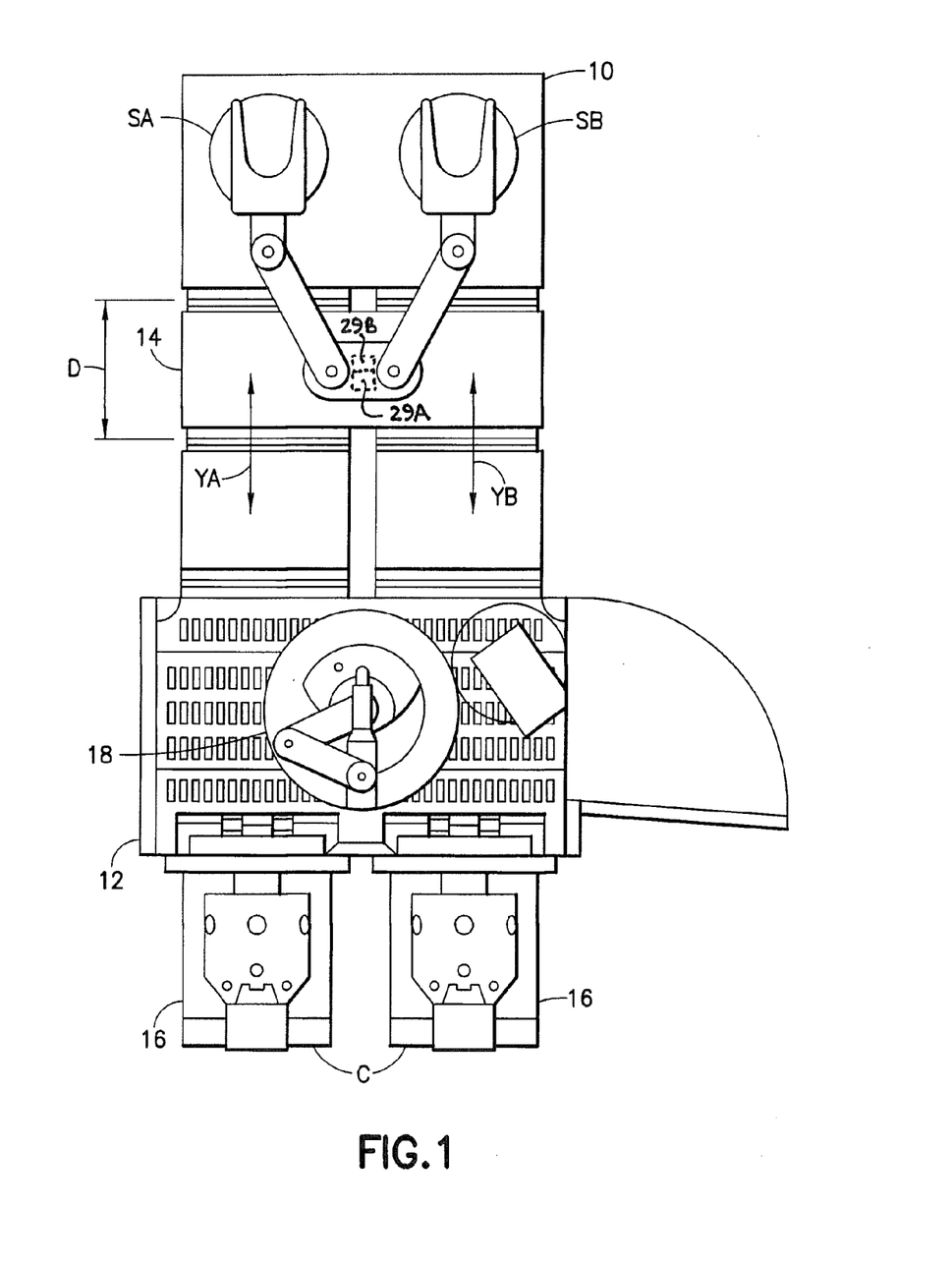
FIG. 1 is a schematic illustration of an exemplary processing apparatus in accordance with an exemplary embodiment.

The processing apparatus 10 in the exemplary embodiment shown in FIG. 1 has a representative configuration, and in alternate embodiments the processing apparatus may have any other desired configuration. The apparatus 10 may be sized and shaped to allow for example processing of semiconductor substrates or wafers, such as 200 mm, 300 mm, 350 mm, 400 mm or even larger diagram wafers. In alternate embodiments, the processing apparatus may be capable of processing any other desired substrate including, but not limited to, substrates for flat panel displays. In the exemplary embodiment shown in FIG. 1, the apparatus 10 may generally have a front section 12 and a rear section 14. The front section 12 may be arranged to provide an interface to apparatus 10 with the rest of the FAB. For example the front section 12 may be an environmentally controlled module with one or more load ports 16 (two are shown for example purposes) allowing docking of substrate carriers such as SMIFs, FOUPs. The loadports may be situated to allow loading/unloading of carriers C automatically, such as via an interface with FAB automated material handling systems or vehicles, or via manual means. The front section 12 may have a transport apparatus 18 for loading/unloading substrates between apparatus 10 and the carriers C docked at the apparatus interface. The transport apparatus 18, may be fixed or mounted on a track depending on the number carrier interfaces and/or load locks that the transport apparatus serves. An exemplary transport of this type is described in commonly owned U.S. Pat. No. 6,002,840 the disclosure of which is incorporated herein by reference in its entirety. The transport apparatus 18 may include a Z-axis drive and/or the carrier interfaces may include a cassette elevator/indexer. A suitable example of a tool front section, similar to front section 12, is described in U.S. patent application Ser. No. 11/178,836, filed, Jul. 11, 2005, incorporated by reference herein in its entirety. In alternate embodiments, the apparatus front section may have any other desired configuration. In other alternate embodiments, the apparatus may not have a segregated or otherwise discernible front end section in that the rear section may communicate directly with the apparatus loading interface without intervening load locks.

Figure 1A:
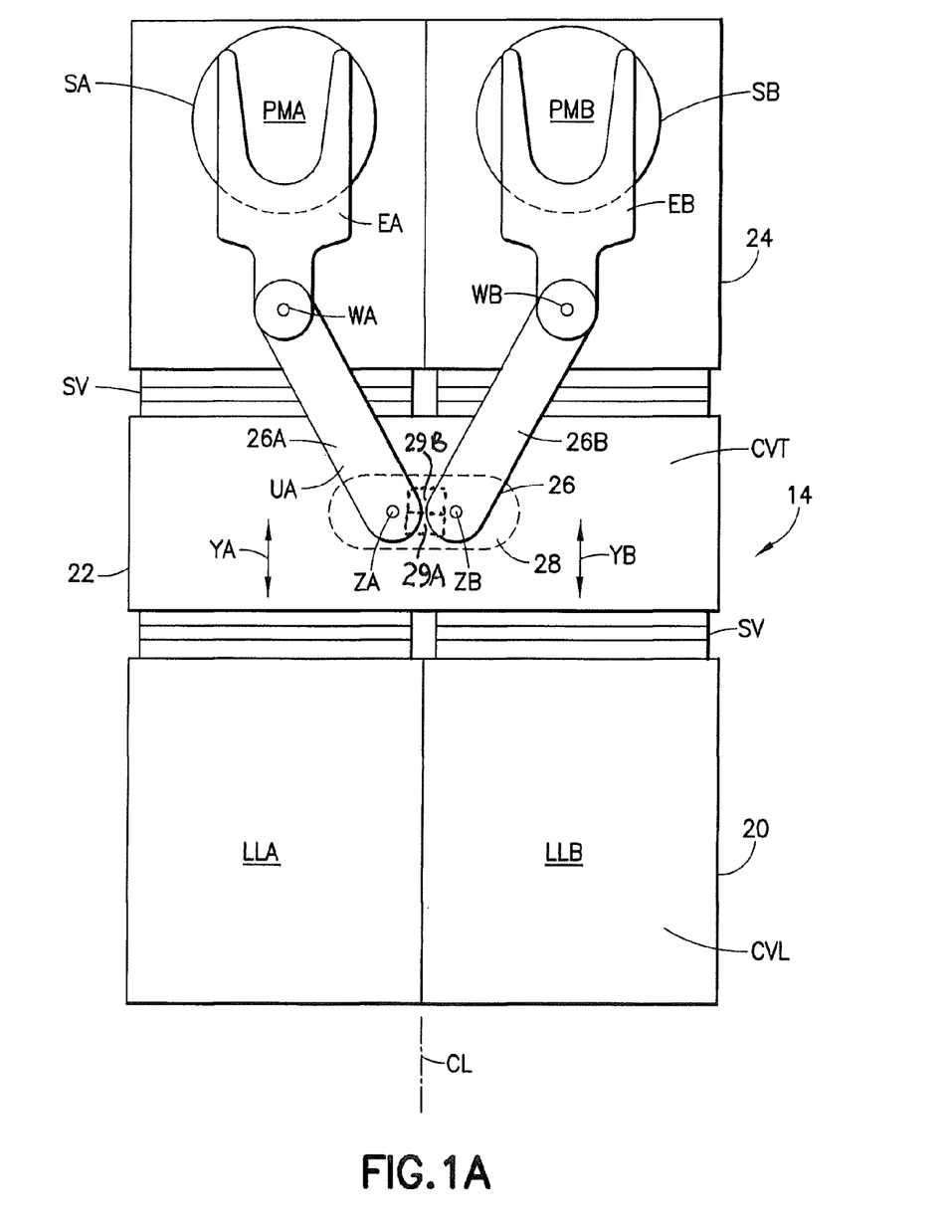
FIG. 1A is a schematic illustration of a portion of the exemplary processing apparatus of FIG. 1 in accordance with an exemplary embodiment.

Referring now also to FIG. 1A, the rear section 14 may be capable of holding an isolated atmosphere, isolated both from outside atmosphere, and in the exemplary embodiment capable of being isolated from the atmosphere of the front section. The rear section may hold an inert gas (such as nitrogen ($N_2$) or argon) or the rear section may hold a vacuum. In the exemplary embodiment, the rear section generally has a load lock section 20, a transport chamber 22 and a processing section 24. One or more of the load lock section 20, transport chamber 22 and processing section 24 may include one or more slot valves SV that serve to isolate the rear section 14 and/or one or more of the load lock 20, transport chamber 22 and processing section 24. In one exemplary embodiment, the slot valves may be configured for easy servicing by, for example, dropping the valve out of or otherwise decoupling the valve from a respective opening in, for example, the bottom of the load lock 20, transport chamber 22 and/or processing section 24 without having to disassemble or disconnect the sections 20, 22, 24 of the rear section 14 from each other and/or the processing apparatus 10. It should be realized that in alternate embodiments, the slot valves may be inserted through the top or sides (e.g. inserted through the housing) of the load lock 20, transport chamber 22 and/or processing section 24 rather than the bottom. In other exemplary embodiments the slot valves SV may be located in a coupling that joins one or more of the load lock 20, transport chamber 22 and/or processing section 24. The slot valves SV may be removed from the coupling in a manner substantially similar to that described above. The rear section 14 may also have a substrate transport system 26 for transporting substrates between the load lock and processing section of the apparatus. As may be realized, the load lock section 20, interfacing the rear section with the front, allows transport of substrates between the atmospherically isolated rear section and front without compromise of the isolated atmosphere in the rear section. It is noted that in alternate embodiments one or more of the load locks LLA, LLB of the load lock section 20 may be equipped with a substrate buffer. It is noted that the buffer may be any suitable buffer and may include a substrate cooling feature or any other suitable features to aid in the processing of substrates. The processing section 24 may be arranged to perform any desired processing of the substrates (e.g. material deposition, ion implantation, cleaning, etching, polishing, metrology, etc.). As shown in FIGS. 1-1A, the transport chamber 22 of the apparatus in the exemplary embodiment is a compact transport chamber compared to conventional transport chambers. The rear section of the apparatus, including the processing section 24, load lock section 20 and the transport apparatus 26 may have what may be referred to as a general Siamese or twin configuration as will be described in greater detail below. The transport apparatus 26 may have generally mirroring or opposing scara arrays 26A, 26B driven by a common drive section with a coaxial drive shaft assembly common to both scara arms. The scara arms 26A, 26B are simultaneously moved by the common coaxial drive shaft assembly so that movement of one scara arm 26A, 26B mirrors movements of the other scara arm 26A, 26B (see also FIGS. 2A-2J and FIGS. 4A-4C) as will be described in greater detail below.

Referring still to FIG. 1A, the transport apparatus in the exemplary embodiment has twin scara arms 26A, 26B arranged in an opposing configuration with respect to an axis CL extending longitudinally from front to back of the apparatus. In the exemplary embodiment the scara arms 26A, 26B may be substantially similar to each other defining a substantially symmetrical arrangement relative to axis CL. In alternate embodiments, the scara arms may be different presenting a somewhat asymmetric arrangement. As may be realized, the scara arm links of the different scara arms may be sized to provide each of the twin arms with different reach dimensions. The transport section 26 may also have a drive section 28 that drives the twin scara arms 26A, 26B. In the exemplary embodiment, the twin scara arms 26A, 26B may be coupled, as will be described in greater detail below so that, when driven by the drive section 28, the scara arms may be capable of substantially simultaneously transporting multiple substrates SA, SB (in the exemplary embodiment two) along axis CL between the load lock section and transport chamber, and substantially transporting the multiple substrates SA, SB along axis CL between the processing section 24 and the transport chamber 22. As noted above and can be seen opposed in FIG. 1A, in the exemplary embodiment the twin scara arms 26A, 26B are similar to each other but substantially mirrored, and hence will be described below with specific reference to one of the scara arms 26A.

The scara arm 26A in the exemplary embodiment has a one link, two independent degree of freedom (in the horizontal reference frame) configuration. In particular, the scara arm 26A has an upper arm link UA pivotally mounted to rotate about axis of rotation ZA (also may be referred to as shoulder axis). The upper arm link is otherwise rigid (i.e. unarticulated) The scara arm 26A may also have an end effector EA that is pivotally mounted to the upper arm link allowing rotation of the end effector relative to the arm link about arm axis of rotation WA (may also be referred to as wrist axis). Thus, the arm 26A is capable of rotation as a unit about shoulder axis ZA and the end effector EA is capable of rotation (relative to link UA) about wrist axis WA. In the exemplary embodiment, the arm link UA of arm 26A and its end effector EA may each be capable of independent rotation, at least with respect to each other, and hence providing the arm with at least two independent degrees of freedom. In alternate embodiments, the scara arm may have any desired arrangement with more or fewer arm links, and having more or fewer degrees of freedom. As seen in FIG. 1A, the opposing scara arm 26B (opposite to scara arm 26A) has a shoulder axis of rotation ZB, and wrist axis of rotation WB similar to (but located opposite the longitudinal axis CL from) axes ZA, WA (of arm 26A). Moreover as well noted before, and as will be described in greater detail below, the twin scara arms 26A, 26B are coupled to each other so that the respective axes of rotation (particularly wrist axes WA, WB) remain substantially opposite each other across longitudinal axis CL throughout the range of motion of the respective scara arms. In alternate embodiments, the axes of rotation similar to axes WA, WB may not remain opposite each other and the amount of rotation of the arm links and end effectors may be the same or may be different.

As seen best in FIG. 1A, in the exemplary embodiment the upper arm link UA and end effector EA may be sized so that with a substrate SA stably held thereon the end effector and substrate combined is substantially of equal length to the upper arm link, and arranged to maximize reach with the opposing twin scara arm configuration, shown in FIG. 1A, for minimum space envelope/interior of the transport chamber. In alternate embodiments, the relative sizes of the end effector and arm links may be set as desired, such as the end effector may be longer than the upper arm link or vice versa. In still other embodiments, the relative sizes of the end effector and arm links of the different opposing arms of the transport apparatus may be different, such as one arm having different length end effector and upper arm link, and the opposing arm having another proportional relationship between end effector and arm links.

Figure 3:
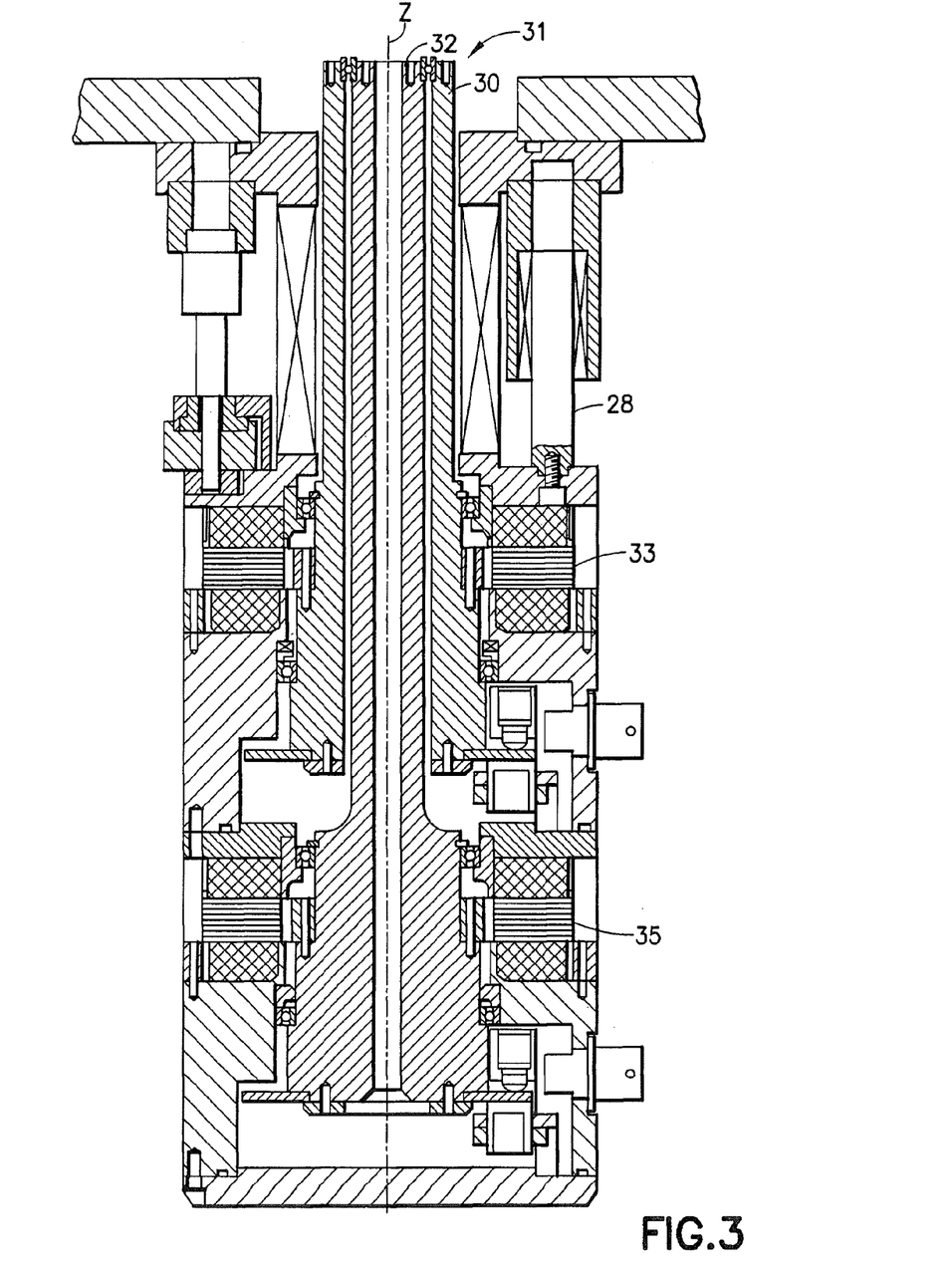
FIG. 3 illustrates an exemplary drive in accordance with an exemplary embodiment.

Referring now to FIG. 3, there is shown a cross-sectional view of drive section 28 of the apparatus in accordance with the exemplary embodiment. The drive section 28 may include any suitable drive(s) including, but not limited to, self bearing or bearingless drives and bearing drives. In the exemplary embodiment, the drive section has a coaxial shaft assembly 31, with concentric shafts 30, 32 rotating about common axis of rotation Z. In alternate embodiments the shafts of the drive section may have a side by side arrangement. Each shaft 30, 32 is independently driven by a suitable motor 33, 35 (for example a brushless D.C. motor, stepper motor, or any other suitable motor). Hence outer shaft 30 may be driven by motor 33 (the motor rotor being directly affixed to the shaft as shown) and inner shaft 32 may be driven by motor 35 (the motor rotor of motor 35 may also be affixed to the drive shaft). The motors and drive shafts may have suitable control instrumentation (e.g. encoders) and may be communicably connected to a suitable controller (not shown) to controllably operate the motors for desired drive shaft motion/rotation. A suitable example of a drive section having features similar to drive section 28 of the exemplary embodiment is the drive section of the MAGNATRAN® transport apparatus available from Brooks Automation, Inc. Another suitable example of a drive section similar to drive 28 is described in U.S. Pat. No. 5,720,590 and its progeny, all of which are incorporated by reference herein in their entirety. The drive section may be capable of moving the arms along the Z axis via a suitable indexer. As noted before, the coaxial shaft assembly 31, of drive section 28, is coupled to both scara arms 26A, 26B and drives the movements of both scara arms. Thus, both of the scara arms 26A, 26B are driven by common coaxial drive shaft assembly 31. In the exemplary embodiment, one shaft (e.g. outer shaft 30) may be coupled to and propel the upper arm links UA, UB of each arm 26A, 26B (rotating the respective arm link about its shoulder axis ZA, ZB). The other shaft (e.g. inner shaft 32) may be coupled to and propel the end effector EA, EB of each arm 26A, 26B (rotating the respective end effectors about its wrist axis WA, WB). Hence, in the exemplary embodiment the end effector EA, EB of each arm 26A, 26B is independently driven relative to the corresponding upper arm link UA, UB of the given arm (providing each arm with at least two independent degrees of freedom), and the end effectors and upper arm links of the respective arms are coupled to each other.

In the exemplary embodiments, the coupling between respective end effectors EA, EB and upper arm links UA, UB of the twin opposing arms 26A, 26B may be arranged to generate substantially symmetrical but mirrored opposite movements. In alternate embodiments, the coupling may provide any other desired movements of the respective end effectors EA, EB and upper arm links UA, UB of the transport arms 26A, 26B. As may be realized, in the exemplary embodiment, the end effector EA, EB and upper arm link UA, UB of one scara arm 26A, 26B may be operably connected to the shafts 30, 32 via a direct transmission 29A, and the other (opposite) scara arm may be connected to the shafts 30, 32 by a reverse rotation transmission 29B (rotation by drive shaft is reversed across transmission to result in counter rotation of driven member). The transmissions may be of any desired type such as band/belt and pulley or any other suitable transmission. As can be seen in FIG. 1A the shoulder ZA, ZB of each of the arms 26A, 26B are located in a side by side arrangement but in alternate embodiments the shoulders or axes of rotation ZA, ZB of each of the arms 26A, 26B may have any suitable arrangement such as, for example, a coaxial arrangement. In alternate embodiments each of the twin opposing arms may be configured with two differentially coupled end effectors that may allow for the fast swapping of substrates (e.g. the end effectors rotate in equal and opposite directions). For example, one of the differentially coupled end effectors on one of the arms may pick a processed substrate while the other differentially coupled end effector places an unprocessed substrate within the processing section 24.

Referring again to FIG. 1A, in the exemplary embodiment shown the load locks LLA, LLB of the load lock section 20 and the process modules PMA, PMB of the processing section 24 are arranged in a generally in-line manner along path lines YA, YB. Accordingly, in the exemplary embodiment, one of the opposing twin scara arm transports substrate across the transport chamber 22 between load lock LLA and processing module PMA, and the opposite arm transports substrate between load lock LLB and processing module PMB. In the exemplary embodiment, the transport chamber may have a substantially hexahedron shape, and may be sized to provide minimum space envelope for the transport apparatus. This is best illustrated in FIG. 2F, which shows a schematic plan view of the transport chamber 22 and transport apparatus 26 in a position having the smallest plan profile (with the end effectors extending substantially orthogonal to longitudinal axis CL). In alternate embodiments, the transport chamber may have any other desired configuration.

In one exemplary embodiment the interior walls (e.g. top, bottom and sides) or internal cavity CVT of the transport chamber 22 may be contoured to follow a path of the substrate as it moves within the chamber 22 as described in U.S. Pat. No. 6,918,731, the disclosure of which is incorporated by references herein in its entirety. For example the interior cavity CVT of the transfer chamber 22 may be designed to allow only enough space to permit free operation of the transport 26. By providing only sufficient operating clearance between the top, bottom and walls of the interior cavity of the transport chamber 22, the volume of the transport chamber 22 may be minimized. This enables the cycle time of pumping the transport chamber 22 to, for example, vacuum to be minimized which in turn may increase throughput of the processing apparatus. It is noted that the interior cavity CVL of the load locks LLA, LLB may also be contoured to a path of the substrate in a manner substantially similar to that described above with respect to the transport chamber 22 such that, for example, pump down cycle time of the load locks may be decreased to increase the throughput of the processing apparatus. Where the load locks LLA, LLB are configured with buffer systems suitable seals may be provided to isolate the buffer indexer (e.g. drive system) from an interior portion of the load lock LLA, LLB so that the additional volume of the buffer indexer is not included as part of the load lock LLA, LLB volume with respect to the pump down cycle times.

Figure 2A:
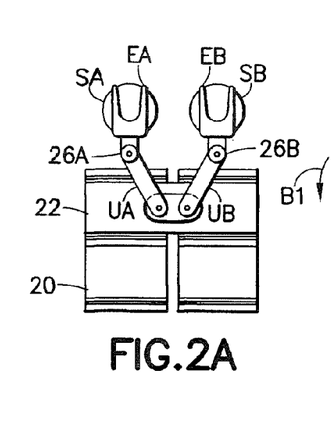
FIGS. 2A-2J illustrate a transport path of a substrate transport in accordance with an exemplary embodiment.
Figure 2B:
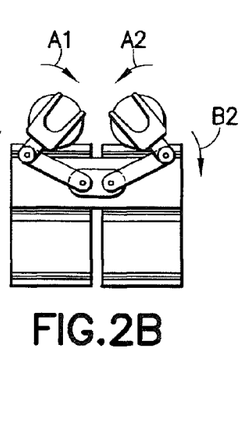
Figure 2C:
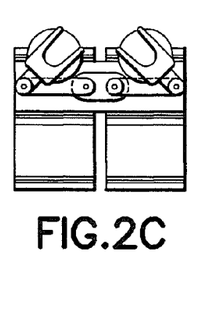
Figure 2D:
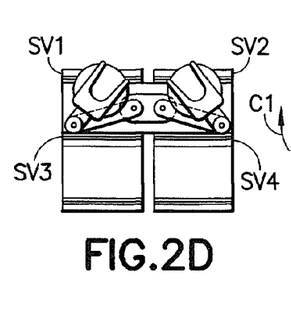
Figure 2E:
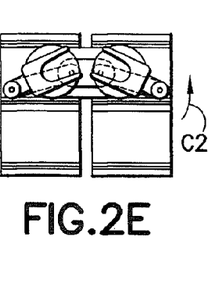
Figure 2F:
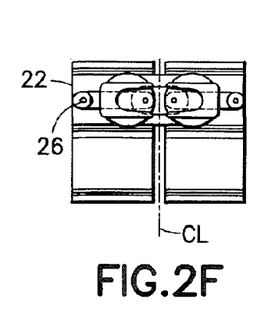
Figure 2G:
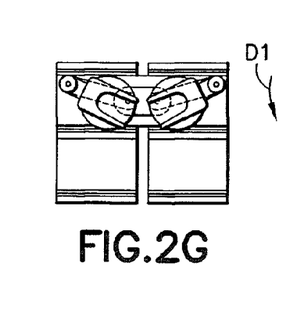
Figure 2H:
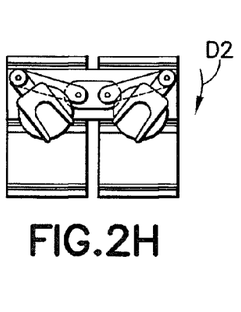
Figure 2I:
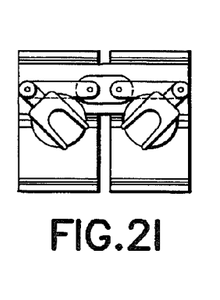
Figure 2J:
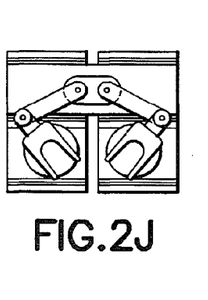

FIGS. 2A-2J are schematic plan views of the rear section of apparatus 10 showing the transport apparatus in different representative positions illustrating the movement of the opposing twin scara arms when moving substrates between respective process modules. For example purposes only the extended position of the twin arms 26A, 26B shown in FIG. 2A is referred to as the start position. It is noted that the terms "extended" and "start" positions are used merely as a convenience in describing the motion of the arms 26A, 26B. As shown in FIG. 2A the arms 26A, 26B may be extended into the processing section 24 (see FIG. 1A) which is not shown in FIGS. 2A-2J for clarity purposes. To retract the arms 26A, 26B from the extended position in FIG. 2A the drive 28 and the transmission described above causes the upper arms UA, UB to respectively rotate in the direction of arrows B1 and B2. The drive 28 and transmission may also cause the end effectors EA, EB to respectively rotate in the direction of arrows A1 and A2. As can be seen in FIGS. 2A-2J the rotation of the upper arm UA and end effector EA of scara arm 26A may be substantially equal and opposite the rotation of the upper arm UB ad end effector EB of scara arm 26B. In alternate embodiments the rotation of the upper arms UA, UB and end effectors EA, EB may not be substantially equal and opposite. The upper arms UA, UB and end effectors EA, EB are rotated such that the substrates SA, SB carried on the respective arms 26A, 26B do not contact the edges of, for example slot valves SV1-SV4 or the interior walls of the process section 24 and transport chamber 22 (e.g. there is sufficient clearance between the substrates SA, SB and any obstructions at any point during the transport of the substrate). The upper arms UA, UB and end effectors EA, EB may also be rotated such that the paths of the substrates SA, SB carried on the respective end effectors EA, EB are substantially parallel to each other as the substrates SA, SB are moved within and into and out of the processing modules. As can be seen in FIG. 2E as the substrates SA, SB are substantially within the transport chamber 22 direction of rotation of the upper arms UA, UB changes so that the arms respectively rotate in the direction of arrows C1 and C2 so that the arms 26A, 26B come to a neutral position as shown in FIG. 2F. Again the term "neutral" is merely used for convenience in describing the motion of the arms 26A, 26B. It is noted that in the exemplary embodiments the upper arms UA, UB may be over rotated relative to the end effector, during transport of substrates, as seen in FIGS. 2D-2G. This allows the process modules and load locks in the exemplary embodiment to be positioned closer to each other (i.e. the distance D shown in FIG. 1 is minimized), thereby reducing the overall footprints of the apparatus. In other words, a retracted configuration of the transport apparatus effects a distance between the at least one load lock and the at least one processing module that is substantially equal to the diameter of the substrate, the width of isolation valves connecting the chamber to the at least one load lock and at least one processing module plus an amount of clearance between walls of the chamber and the transport apparatus that is only sufficient enough to allow operation of the twin scara arms with the chamber. In alternate embodiments, the transports may have any other desired movements to transport the substrates. In the neutral position the end effectors EA, EB may be substantially in-line with their respective upper arms UA, UB so that the volume of the transport chamber can be minimized and to bring the process modules and load locks closer together as described above. Extension of the arms 26A, 26B into the process section 24 occurs in substantially an opposite manner to the retraction of the arms from the process section 24 described above.

To extend the arms 26A, 26B into the load locks 20 as shown in FIGS. 2G-2J from the neutral position, the drive 28 and transmission cause the upper arms UA, UB to respectively rotate in the direction of arrows C1, C2. The end effectors EA, EB may also be caused to respectively rotate in the directions of arrows D1, D2. It is again noted that during transport of the substrates sufficient clearance is maintained between the substrates SA, SB and any obstructions around the transport path. The upper arms UA, UB and end effectors EA, EB may also be rotated such that the path of the substrates SA, SB carried on the respective end effectors EA, EB are substantially parallel to each other as the substrates SA, SB are moved within and into and out of the load locks. Retraction of the arms from the load locks 20 occurs in substantially an opposite manner to the extension of the arms into the load locks 20 described above.

Figure 1B:
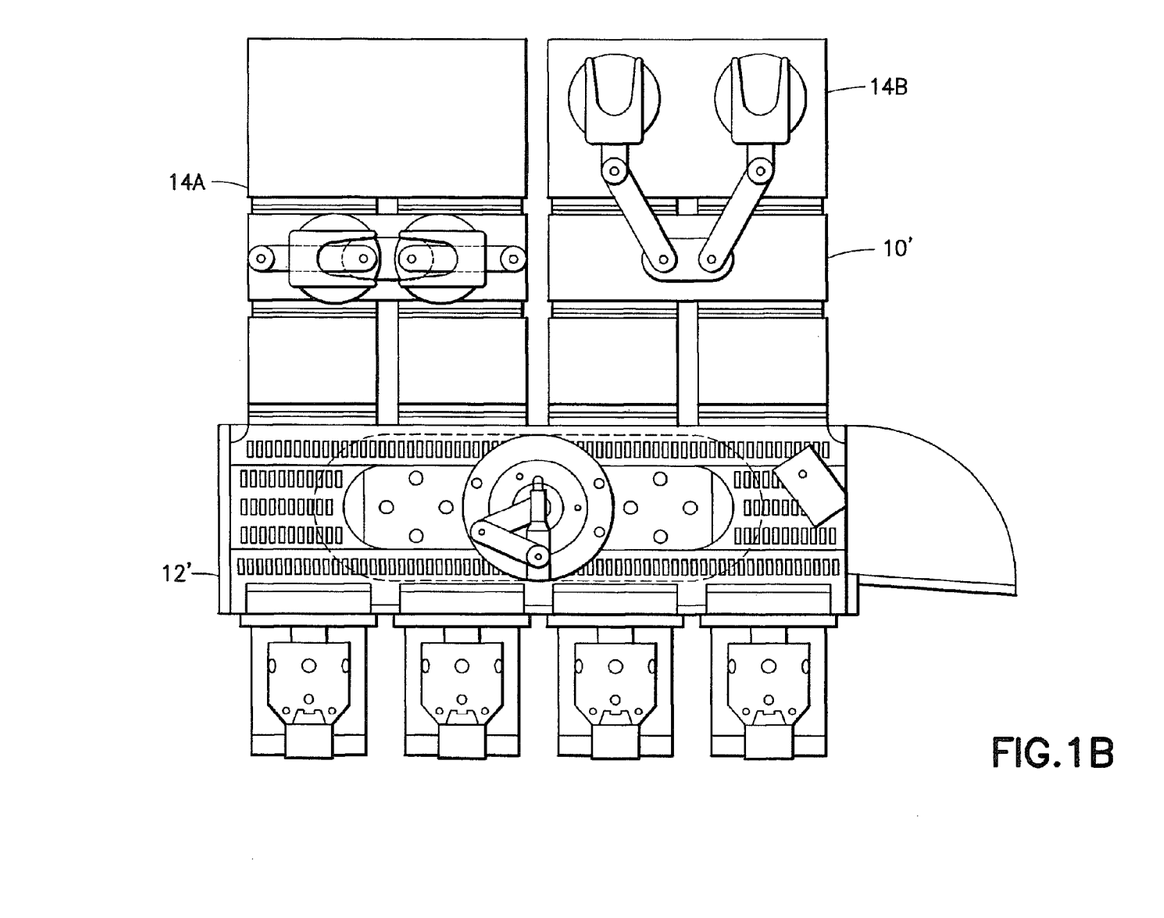
FIG. 1B is a schematic illustration of another exemplary processing apparatus in accordance with an exemplary embodiment.

Referring again to FIG. 1A, in the exemplary embodiment, the processing section 24 may have one common double process module capable of holding two or more substrates. The double process module may communicate with the transport chamber through double slot valves/closable openings, one each substantially in line with the axis YA, YB. As may be realized the opposing twin scara arms may transport substrates in and out of the double processing module in a similar manner to that shown in FIGS. 2A-2J. Referring also to FIG. 1B, there is shown another schematic plan view of a process apparatus 10' similar to apparatus 10 and illustrating that the apparatus is scalable and may be expanded to have multiple transport apparatus similar to transport 26. For example, the front section 12' may be substantially similar to front section 12 but may be configured to interface with two or more rear sections 14A, 14B as can be seen in FIG. 1B. The rear sections 14A, 14B may be substantially similar to rear section 14 described above. The number of rear sections 14A, 14B that are interfaced with the front section 12' may only be limited by, for example, the width of the front section 12'.

Figure 4:
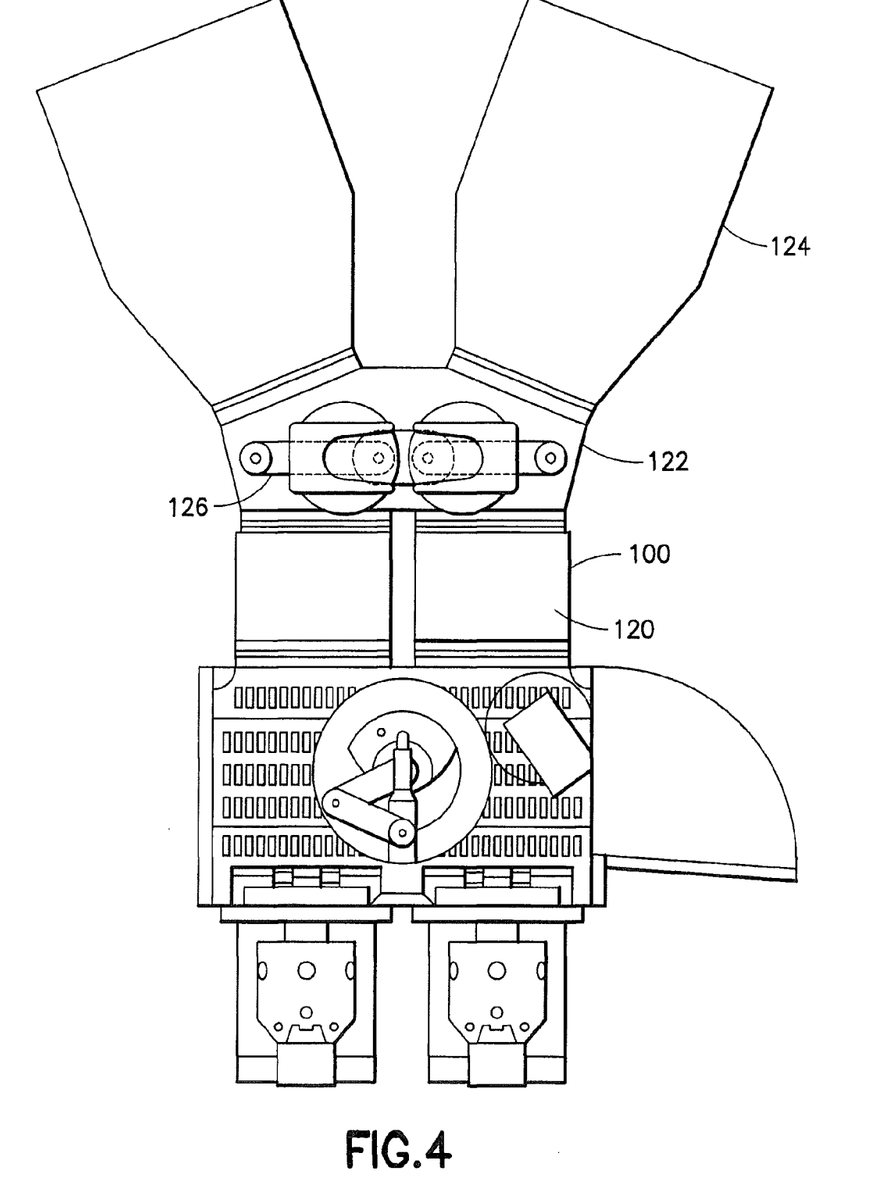
FIG. 4 is a schematic illustration of still another exemplary processing apparatus in accordance with an exemplary embodiment.
Figures 4A, 4B, 4C:
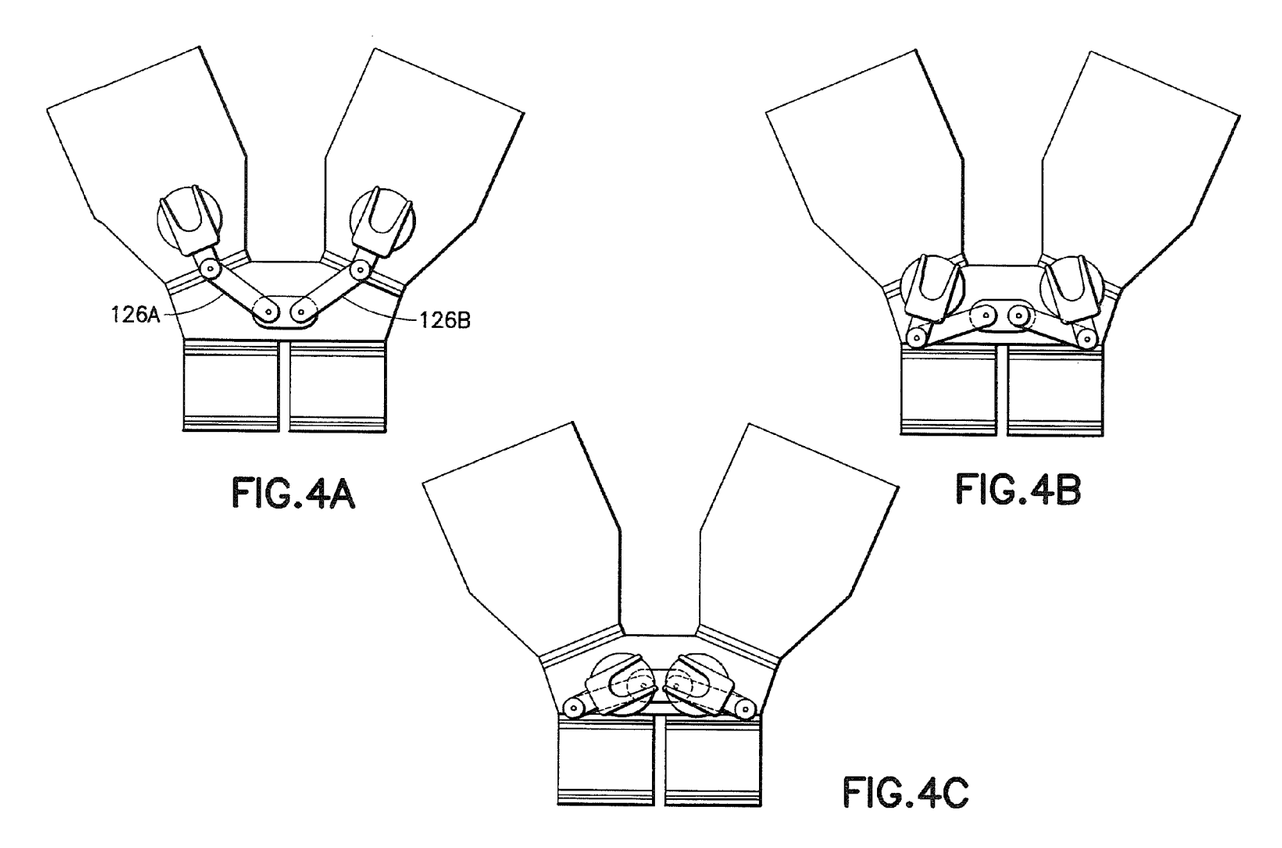
FIGS. 4A-4C illustrate a transport path of a substrate transport in accordance with an exemplary embodiment.

FIGS. 4 and 4A-4C are other schematic plan views of another processing apparatus 100 in accordance with another exemplary embodiment. Process apparatus 100 is generally similar to apparatus 10, and has two substantially parallel process modules in process section 124. In this embodiment, the two process modules may be arranged somewhat at an angle as shown. The angle may be any suitable angle and the processing apparatus may have more or less two process modules. The position or movement of the opposing twin scara arms 126A, 126B of the transport apparatus 126, when simultaneously moving substrates to and from the process modules is shown in FIGS. 4A-4C. Extension of the arms 126A, 126 into/from the process section 124 and into/from the load locks 120 occurs in a manner substantially similar to that described above with respect to FIGS. 2A-2J.

It should be understood that the foregoing description is only illustrative of the embodiments. Various alternatives and modifications can be devised by those skilled in the art without departing from the embodiments. Accordingly, the present embodiments are intended to embrace all such alternatives, modifications and variances that fall within the scope of the appended claims.

What is claimed is:

1. A substrate processing apparatus comprising:
   a chamber capable of holding an isolated atmosphere and having a front and rear disposed along a longitudinal axis; and
   a transport apparatus located in the chamber, and having twin scara arms and a drive section with a coaxial drive shaft assembly having two independently driven drive shafts, each shaft of the coaxial drive shaft assembly being operably connected by a transmission unit to at least one rotatable link of both scara arms to move the twin scara arms, wherein each of the twin scara arms has two independent degrees of freedom and movement of one of the twin scara arms mirrors movement of another of the twin scara arms across the longitudinal axis.

2. The substrate processing apparatus of claim 1, further comprising at least one load lock coupled to the front of the chamber and at least one processing module coupled to the rear of the chamber.

3. The substrate processing apparatus of claim 2, wherein the at least one processing module comprises at least two processing modules that are substantially parallel with the longitudinal axis.

4. The substrate processing apparatus of claim 2, wherein the at least one processing module comprises at least two processing modules that are oriented at an angle with respect to the longitudinal axis.

5. The substrate processing apparatus of claim 2, wherein the at least one processing module comprises a common double process module capable of holding two or more substrates.

6. The substrate processing apparatus of claim 2, wherein the at least one load lock comprises a substrate buffer system.

7. The substrate processing apparatus of claim 1, wherein the twin scara arms extend along radially distinct or horizontally spaced transfer paths.

8. A substrate transport apparatus comprising:
 a drive section having a coaxial shaft assembly with two independently rotatable drive shafts; and
 a first scara arm rotatably coupled to a transmission unit at a first axis of rotation and a second opposing scara arm rotatably coupled to the transmission unit at a second axis of rotation;
 wherein the transmission unit is coupled to the coaxial shaft assembly of the drive section and is configured to couple the first and second scara arms to the coaxial shaft assembly of the drive section so that the movement of the first arm is coupled to movement of the second arm where each shaft of the coaxial shaft assembly is common to both the first and second scara arms and each of the first and second scara arms has two degrees of freedom and movement of the second scara arm mirrors simultaneous movement of the first scara arm across an axis of extension and retraction of the first and second scara arms.

9. The substrate transport apparatus of claim 8, wherein each of the first and second scara arms have an upper arm and end effector, the upper arms of the first and second scara arm being driven by a first shaft of the coaxial shaft assembly and the end effectors of the first and second scara arms being driven by the second shaft of the coaxial shaft assembly.

10. The substrate transport apparatus of claim 8, wherein the transmission unit includes a direct transmission for coupling the first scara arm to the drive section and a reverse rotation transmission for coupling the second scara arm to the drive section where the reverse transmission effects the mirrored movement of the second scara arm.

11. The substrate transport apparatus of claim 8, wherein arm links of the first and second scara arms are sized to provide each of the first and second scara arms with different reach dimensions.

12. The substrate transport apparatus of claim 8, wherein each of the first and second scara arms include an upper arm and an end effector, the end effector of each scara arm being sized so that the end effector and a substrate combined have a substantially equal length with a respective upper arm when the end effector is holding the substrate.

13. The substrate transport apparatus of claim 12, wherein the substrate transport apparatus is located within a transport chamber having a minimized interior volume and the upper arms and end effectors of each of the first and second scara arms are arranged to maximize reach with the opposing arm configuration for the minimized interior volume of the transport chamber.

14. A substrate processing apparatus comprising:
 a chamber having a front and rear disposed along a longitudinal axis, the front of the chamber being coupled to at least one load lock and a rear of the chamber being coupled to at least one processing module; and
 a transport apparatus located in the chamber for transporting substrates between the at least one load lock and the at least one processing module, the transport apparatus having opposing twin two link scara arms each having an upper arm link and an end effector depending from the upper arm link, wherein movement of another twin scara arms mirrors simultaneous movement of another of the twin scara arms across the longitudinal axis;
 wherein
  a retracted configuration of the transport apparatus effects a distance between the at least one load lock and the at least one processing module that is substantially equal to the diameter of the substrate, the width of isolation valves connecting the chamber to the at least one load lock and the at least one processing module plus an amount of clearance between walls of the chamber and the transport apparatus that is only sufficient enough to allow operation of the twin scara arms within the chamber, and
  the transport apparatus includes a drive section having a coaxial shaft assembly coupled to a transmission, where the transmission unit includes a direct transmission for coupling a first one of the twin scara arms to the drive section and a reverse rotation transmission for coupling a second one of the twin scara arms to the drive section where the reverse transmission effects the mirrored movement of the second scara arm.

15. The substrate processing apparatus of claim 14, wherein the chamber has an interior volume where a top, bottom and walls of the chamber are sized to provide only the sufficient operating clearance for the twin scara arms.

16. The substrate processing apparatus of claim 14, wherein each of the twin scara arms include an upper arm and an end effector, the end effector of each scara arm being sized so that the end effector and the substrate combined have a substantially equal length with a respective upper arm when the end effector is holding the substrate.

17. The substrate processing apparatus of claim 14, wherein each of the twin scara arms includes an upper arm and at least one end effector, where the upper arms are driven by a first shaft of the coaxial shaft assembly and the at least one end effectors are driven by the second shaft of the coaxial shaft assembly.

18. The substrate processing apparatus of claim 14, wherein the at least one processing module comprises at least two processing modules that are substantially parallel with the longitudinal axis.

19. The substrate processing apparatus of claim 14, wherein the at least one processing module comprises at least two processing modules that are oriented at an angle with respect to the longitudinal axis.

20. The substrate processing apparatus of claim 14, wherein the at least one processing module comprises a common double process module capable of holding two or more substrates.

* * * * *

UNITED STATES PATENT AND TRADEMARK OFFICE
CERTIFICATE OF CORRECTION

PATENT NO.        : 9,117,859 B2                                    Page 1 of 1
APPLICATION NO.   : 11/848845
DATED             : August 25, 2015
INVENTOR(S)       : Krupyshev et al.

It is certified that error appears in the above-identified patent and that said Letters Patent is hereby corrected as shown below:

Claims

Column 10, Claim 14, line 14, "another" should be deleted and replaced with --one of the--

Signed and Sealed this
Twenty-second Day of December, 2015

Michelle K. Lee
*Director of the United States Patent and Trademark Office*